United States Patent [19]

Tsuda et al.

[11] Patent Number: 5,397,681
[45] Date of Patent: Mar. 14, 1995

[54] LAMINATE USED FOR THE PRODUCTION OF A DRY PLANOGRAPHIC PRINTING PLATE

[75] Inventors: Mikio Tsuda, Ohmihachiman; Ken Kawamura, Shiga; Norimasa Ikeda, Ohtsu; Masanao Isono, Otsu, all of Japan

[73] Assignee: Toray Industries, Inc., Japan

[21] Appl. No.: 23,195

[22] Filed: Feb. 25, 1993

[30] Foreign Application Priority Data

Aug. 20, 1992 [JP] Japan .................. 4-221743

[51] Int. Cl.⁶ .................. G03C 1/76; G03F 7/027
[52] U.S. Cl. .................. 430/272; 430/273; 430/281; 430/288; 430/303
[58] Field of Search .......... 430/272, 273, 303, 300, 430/288, 281

[56] References Cited

U.S. PATENT DOCUMENTS

| | | | |
|---|---|---|---|
| Re. 30,670 | 7/1981 | Ezumi et al. | 430/281 |
| 3,894,873 | 7/1975 | Kobayashi et al. | 430/303 |
| 4,342,820 | 8/1982 | Kinashi et al. | 430/11 |
| 4,358,522 | 11/1982 | Fujita et al. | 430/166 |
| 4,772,538 | 9/1988 | Walls et al. | 430/281 |
| 4,822,720 | 4/1989 | Walls et al. | 430/288 |
| 5,069,999 | 12/1991 | Hisashi et al. | 430/273 |

FOREIGN PATENT DOCUMENTS

| | | |
|---|---|---|
| 54-26923B | 9/1979 | Japan . |
| 56-23150B | 5/1981 | Japan . |
| 61-153655A | 7/1986 | Japan . |
| 61-54218B | 11/1986 | Japan . |
| 61-54222B | 11/1986 | Japan . |
| 3-56622B | 8/1991 | Japan . |

*Primary Examiner*—Janis L. Dote
*Attorney, Agent, or Firm*—Austin R. Miller

[57] ABSTRACT

According to the present invention there is provided a laminate comprising a photosensitive layer and a silicone rubber layer both laminated successively onto a base substrate, in which a main component of the photosensitive layer is formed by an adduct obtained by an addition reaction of a photopolymerizable glycidyl (meth)acrylate and a monoglycidyl ether compound not having a photopolymerizable group with a diamine compound. Because of using a photosensitive layer having such a specific composition as mentioned above, the dry planographic printing plate obtained from the present invention is suitably employable in commercial web offset printing and newspaper web offset printing.

12 Claims, No Drawings

LAMINATE USED FOR THE PRODUCTION OF A DRY PLANOGRAPHIC PRINTING PLATE

BACKGROUND OF THE INVENTION

The present invention relates to a dry planographic printing plate and more particularly to a dry planographic printing plate superior in shape retaining property, durability and image reproducibility.

As to dry planographic printing plates using a silicone rubber layer as an ink-repellent layer, various such printing plates have already been proposed. Particularly, the following dry planographic printing plates permit a practical printing without using dampening water: a dry planographic printing plate including a photopolymerizable adhesive layer and a silicone rubber layer both laminated onto a base substrate, as proposed in Japanese Patent Publication Nos. JP 54-26923B and JP 56-23150B; a dry planographic printing plate including a photodimerizing type photosensitive layer and a silicone rubber layer both laminated onto a base substrate, as proposed in Japanese Patent Publication No. JP 3-56622B and Patent Laid Open No. JP 61-153655A; a dry planographic printing plate including a photosensitive layer containing an orthoquinonediazide compound and lined with a support, and a silicone rubber layer formed on the photosensitive layer through an adhesive layer, as proposed in Japanese Patent Publication No. 61-54222B; and a dry planographic printing plate including a photostripping type photosensitive layer and a silicone rubber layer formed thereon, as proposed in Japanese Patent Publication No. JP 61-54222B.

The present inventors have made a further detailed study about the performance, especially durability, of dry planographic printing plates obtained by such typical conventional techniques. For example, the present inventors have fabricated a dry planographic printing plate using a photocurable photosensitive layer as described in the working examples of Japanese Patent Publication No. JP 54-6923B, and conducted an offset printing, using the printing plate thus fabricated. As a result, repeated stress was applied between the photosensitive layer and the silicone rubber layer, resulting in fractures at the bonded interface between both layers, thus making it impossible to obtain a high durability.

Also, the present inventors have fabricated a dry planographic printing plate using a photodimerizing type photosensitive layer as described in the working examples of Japanese Patent Publication No. JP 3-56622B and Patent Laid Open No. JP 61-153655A, and conducted an offset printing, using the printing plate thus fabricated. As a result, there occurred drop-out of the silicone rubber layer because of a low bonding force between the photosensitive layer and the silicone rubber layer, thus making it impossible to obtain high durability.

Further, the present inventors have fabricated a dry planographic printing plate using a photodecomposing type photosensitive layer as described in the working examples of Japanese Patent Publication Nos. JP 61-54218B and JP 61-54222B. As a result, there occurred fractures of the photosensitive layer and even the silicone rubber layer was cracked, so that it was impossible to attain high durability.

The following became clear as a result of further investigation of the cause in connection with the above-mentioned problems. In the case where a dry planographic printing plate is used in the field of commercial web offset printing presses, a durability of 100,000 to 600,000 copies is required, but since printing is performed at a speed of 600 to 1,000 r.p.m., a repetitive stress is applied to the dry planographic printing plate during the transfer of ink between the printing plate and the blanket, with the result that fractures are apt to occur in the silicone rubber layer and also at the bonded interface between the photosensitive layer and the silicone rubber layer, thus making it impossible to obtain high durability. Further, in the case where a dry planographic printing plate is used in the field of web offset printing presses for newspaper, printing is performed at a speed of 150,000 sheets per hour; besides, the paper which is printed is poor in smoothness, and it is a woody paper containing much paper dust, resulting in paper dust piled on the blanket, and at the time of ink transfer from the printing plate to the blanket, the paper dust strikes the printing plate, causing fractures of the silicone rubber layer and the photosensitive layer. For this reason, there is obtained a durability of only 10,000 sheets or so.

Having made intensive studies about a measure for solving the aforementioned problems of the prior art, the present inventors found out that the foregoing drawbacks could be eliminated to a satisfactory extent by the use of a photosensitive layer of a specific composition and that there could be obtained thereby a dry planographic printing plate superior in durability without deterioration in image reproducibility. In this way we accomplished the present invention.

Accordingly, it is the object of the present invention to provide a dry planographic printing plate which is remarkably superior in durability and also superior in image reproducibility even in the case of being used in the field of commercial web offset printing presses or the field of web offset printing presses for newspaper.

SUMMARY OF THE INVENTION

The present invention resides in a dry planographic printing plate including a photosensitive layer and a silicone rubber layer both laminated successively onto a base substrate, the photosensitive layer containing a diamine derivative represented by the following general formula (1):

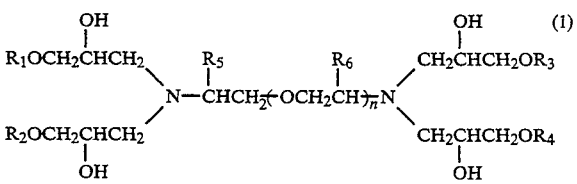

and optionally containing a diamine derivative represented by the following general formula (2):

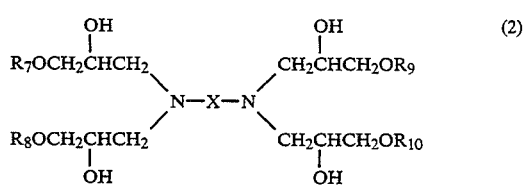

in which formulae (1) and (2), $R_1$, $R_2$, $R_3$, $R_4$, $R_7$, $R_8$, $R_9$ and $R_{10}$ each independently hydrogen, or a hydrocarbon, substituted hydrocarbon, acyl or substituted acyl group having 1 to 20 carbon atoms; $R_5$ and $R_6$ are each independently hydrogen or an alkyl group having 1 to 20 carbon atoms; X is a divalent group selected from the group consisting of

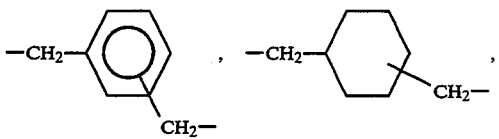

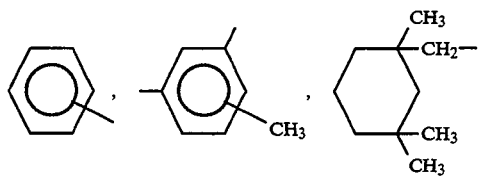

and

and m is 1 ~ 20;

and n is 1 to 50. It is also possible for one to three of $R_7$, $R_8$, $R_9$ and $R_{10}$ in the diamine derivative of the general formula (2) to be acryloyl or methacryloyl groups.

The diamine derivative of the general formula (1) used in the present invention can be prepared by an addition reaction of a diamine compound represented by the general formula

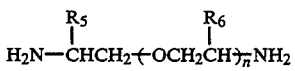

wherein $R_5$, $R_6$ and n are as defined above, and a glycidyl compound represented by the general formula

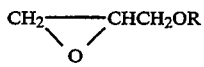

wherein R means $R_1$, $R_2$, $R_3$ and $R_4$. As noted previously, $R_1$ to $R_4$ are each independently hydrogen, or a hydrocarbon, substituted hydrocarbon, acyl or substituted acyl group having 1 to 20 carbon atoms, but it is preferable that at least a part thereof have a photopolymerizable ethylenically unsaturated bond. Also, $R_5$ and $R_6$ may each be independently hydrogen and a methyl group. Particularly, it is preferable that at least a part, more preferably 1 to 4, of $R_1$ to $R_4$ be acryloyl or methacryloyl. In this case, it is preferred that the remainder be hydrocarbon or substituted hydrocarbon groups not having a photopolymerizable group, such as, for example, alkyl, arylalkyl, aryl, or silyl-substituted alkyl having a hydrolyzable group.

In this case, as the compound of the general formula (4), glycidyl acrylate or glycidyl methacrylate, which as the case may be will be referred to hereinafter as "glycidyl (meth)acrylate" (4-1), and a monoglycidyl ether compound (4-2) not having a photopolymerizable group such as that exemplified below, are fed to the addition reaction with the diamine compound of the general formula (3).

The diamine compound of the general formula (1) is a diamine derived from polyethylene glycol or polypropylene glycol, and for convenience' sake, $R_5$ and $R_6$ in the formula are each shown in a bonded state to the carbon atom adjacent to nitrogen, but there also is included the case where they are each bonded to the carbon of the adjacent methylene. The general formula (1) involves both cases.

The following are concrete examples of the diamine compound (3):

Dioxyethylenediamine, trioxyethylenediamine, tetraoxyethylenediamine, pentaoxyethylenediamine, hexaoxyethylenediamine, heptaoxyethylenediamine, octaoxyethylenediamine, nonaoxyethylenediamine, decaoxyethylenediamine, tritriacontaoxyethylenediamine, dioxypropylenediamine, trioxypropylenediamine, tetraoxypropylenediamine, pentaoxypropylenediamine, hexaoxypropylenediamine, heptaoxypropylenediamine, octaoxypropylenediamine, nonaoxypropylenediamine, decaoxypropylenediamine, and tritriacontaoxypropylenediamine.

The following are concrete examples of the monoglycidyl ether compound:

Methyl glycidyl ether, ethyl glycidyl ether, n-propyl glycidyl ether, isopropyl glycidyl ether, n-butyl glycidyl ether, isobutyl glycidyl ether, n-hexyl glycidyl ether, 2-ethylhexyl glycidyl ether, n-decyl glycidyl ether, allyl glycidyl ether, phenyl glycidyl ether, and glycidol.

These compounds are not specially limited in composition, but preferably 1 to 4 moles, more preferably 1 to 3.5 mole, of glycidyl (meth)acrylate (4-1) and 0 to 3 moles, more preferably 0.5 to 3 moles, of monoglycidyl ether compound (4-2), provided the total of (4-1) and (4-2) is 4 moles, relative to 1 mole of diamine compound (3).

As concrete examples of the diamine derivatives represented by the general formula (1), there are mentioned the following, provided no limitation is made thereto:

N,N,N',N'-tetra-(2-hydroxy-3-methacryloyloxypropyl) dioxyethylenediamine, N,N,N',N'-tetra-(2-hydroxy-3-methacryloyloxypropyl) trioxyethylenediamine, N,N,N',N'-tetra-(2-hydroxy-3-methacryloyloxypropyl) tetraoxyethylenediamine, N,N,N',N'-tetra-(2-hydroxy-3-methacryloyloxypropyl) pentaoxyethytenediamine, N,N,N',N'-tetra-(2-hydroxy-3-methacryloyloxypropyl) hexaoxyethylenediamine, N,N,N',N'-tetra-(2-hydroxy-3-methacryloyloxypropyl) heptaoxyethylenediamine, N,N,N',N'-tetra-(2-hydroxy-3-methacryloyloxypropyl) octaoxyethylenediamine, N,N,N',N'-tetra-(2-hydroxy-3-methacryloyloxypropyl) nonaoxyethylenediamine, N,N,N',N'-tetra-(2-hydroxy-3-methacryloyloxypropyl) decaoxyethylenediamine, N,N,N',N'-tetra-(2-hydroxy-3-methacryloyloxypropyl) tritriacontaoxyethylenediamine, N,N,N',N'-tetra-(2-hydroxy-3-acryloyloxypropyl) trioxyethylenediamine N,N,N',N'-tetra-(2-hydroxy-3-acryloyloxypropyl) hexaoxyethylenediamine, N,N,N'-tri-(2-hydroxy-3-methacryloyloxypropyl)-N'-mono-(2-hydroxy-3-methoxypropyl)dioxyethylenediamine, N,N,N'-tri-(2-hydroxy-3-methacryloyloxypropyl)-N'-mono-(2-hydroxy-3-methoxypropyl)trioxyethylenediamine, N,N,N'-tri-(2-hydroxy-3-methacryloyloxypropyl)-N'-mono-(2-hydroxy-3-methoxypropyl)tetraoxyethylenediamine, N,N,N'-tri-(2-hydroxy-3-methacryloyloxypropyl)-N'-mono-(2-hydroxy-3-methoxypropyl)pentaoxyethylenediamine, N,N,N'-tri-(2-hydroxy-3-methacryloyloxypropyl)-N'-mono-(2-hydroxy-3-methoxypropyl)hexaoxyethylenediamine, N,N,N'-tri-(2- hydroxy-3-methacryloyloxypropyl)-N'-mono-(2-hydroxy-3-methoxypropyl)-N'-mono-(2-hydroxy-3-methoxypropyl) heptaoxyethylenediamine, N,N,N'-tri-(2-hydroxy-3-methacryloyloxypropyl)-N'-mono-(2-hydroxy-3-methoxypropyl)octaoxyethylenediamine, N,N,N'-tri-(2-hydroxy-3-methacryloyloxypropyl)-N'-mono-(2-hydroxy-3-methoxypropyl)nonaoxyethylenediamine, N,N,N'-tri-(2-hydroxy-3-methacryloyloxypropyl)-N'-mono-(2-hydroxy-3-methoxypropyl)decaoxyethylenediamine, N,N'-di-(2-hydroxy-3-methacryloyloxypropyl)-N,N'-di-(2-hydroxy-3-methoxypropyl)dioxyethylenediamine, N,N'-di-(2-hydroxy-3-methacryloyloxypropyl)-N,N'-di-(2-hydroxy-3-methoxypropyl)trioxyethylenediamine, N,N'-di-(2-hydroxy-3-methacryloyloxypropyl)-N,N'-di-(2-hydroxy-3-methoxypropyl)tetraoxyethylenediamine, N,N'-di-(2-hydroxy-3-methacryloyloxypropyl)-N,N'-di-(2-hydroxy-3-methoxypropyl)pentaoxyethylenediamine, N,N'-di-(2-hydroxy-3-methacryloyloxypropyl)-N,N'-di-(2-hydroxy-3-methoxypropyl)hexaoxyethylenediamine, N,N,N'-tri-(2-hydroxy-3-methacryloyloxypropyl)-N'-mono-(2-hydroxy-3-butoxypropyl)dioxyethylenediamine, N,N,N'-tri-(2-hydroxy-3-methacryloyloxypropyl)-N'-mono-(2-hydroxy-3-butoxypropyl)tritoxyethylenediamine, N,N,N'-tri-(2-hydroxy-3-methacryloyloxypropyl)-N'-mono-(2-hydroxy-3-butoxypropyl)tetraoxyethylenediamime, N,N,N'-tri-(2-hydroxy-3-methacryloyloxypropyl)-N'-mono-(2-hydroxy-3-butoxypropyl)pentaoxyethylenediamine, N,N,N'-tri-(2-hydroxy-3-methacryloyloxypropyl)-N'-mono-(2-hydroxy-3-butoxypropyl)hexaoxyethylenediamine, N,N,N'-tri-(2-hydroxy-3-methacryloyloxypropyl)-N'-mono-(2-hydroxy-3-butoxypropyl)heptaoxyethylenediamine, N,N,N'-tri-(2-hydroxy-3-methacryloyloxypropyl)-N'-mono-(2-hydroxy-3-butoxypropyl)octaoxyethylenediamine, N,N,N'-tri-(2-hydroxy-3-methacryloyloxypropyl)-N'-mono-(2-hydroxy-3-butoxypropyl)nonaoxyethylenediamine, N,N,N'-tri-(2-hydroxy-3-methacryloyloxypropyl)-N'-mono-(2-hydroxy-3-butoxypropyl)decaoxyethylenediamine, N,N'-di-(2-hydroxy-3-methacryloyloxypropyl)-N,N'-di(2-hydroxy-3-butoxypropyl)dioxyethylenediamine, N,N'-di-(2-hydroxy-3-methacryloyloxypropyl)-N,N'-di(2-hydroxy-3-butoxypropyl)trioxyethylenediamine, N,N'-di-(2-hydroxy-3-methacryloyloxypropyl)-N,N'-di(2-hydroxy-3-butoxypropyl)tetraoxyethylenediamine, N,N'-di-(2-hydroxy-3-methacryloyloxypropyl)-N,N'-di(2-hydroxy-3-butoxypropyl)pentaoxyethylenediamine, N,N'-di-(2-hydroxy-3-methacryloyloxypropyl)-N,N'-di(2-hydroxy-3-butoxypropyl)hexaoxyethylenediamine, N,N,N',N'-tetra-(2-hydroxy-3-methacryloyloxypropyl) dioxypropylenediamine, N,N,N',N'-tetra-(2-hydroxy-3-methacryloyloxypropyl) trioxypropylenediamine, N,N,N',N'-tetra-(2-hydroxy-3-methacryloyloxypropyl) tetraoxypropylenediamine, N,N,N',N'-tetra-(2-hydroxy-3-methacryloyloxypropyl) pentaoxypropylenediamine, N,N,N',N'-tetra-(2-hydroxy-3-methacryloyloxypropyl) hexaoxypropylenediamine, N,N,N',N'-tetra-(2-hydroxy-3-methacryloyloxypropyl) heptaoxypropylenediamine, N,N,N',N'-tetra-(2-hydroxy-3-methacryloyloxypropyl) octaoxypropylenediamine, N,N,N',N'-tetra-(2-hydroxy-3-methacryloyloxypropyl) nonaoxypropylenediamine, N,N,N',N'-tetra-(2-hydroxy-3-methacryloyloxypropyl) decaoxypropylenediamine, N,N,N',N'-tetra-(2-hydroxy-3-methacryloyloxypropyl) tritriacontaoxypropylenediamine, N,N,N',N'-tetra-(2-hydroxy-3-acryloyloxypropyl) trioxypropylenediamine, N,N,N',N'-tetra-(2-hydroxy-3-acryloyloxypropyl) hexaoxypropylenediamine, N,N',N'-tri-(2-hydroxy-B-methacryloyloxypropyl)-N'-mono-(2-hydroxy-3-methoxypropyl)dioxypropylenediamine, N,N',N'-tri-(2-hydroxy-3-methacryloyloxypropyl)-N'-mono-(2-hydroxy-3-methoxypropyl)trioxypropylenediamine, N,N',N'-tri-(2-hydroxy-3-methacryloyloxypropyl)-N'-mono-(2-hydroxy-3-methoxypropyl)tetraoxypropylenediamine, N,N',N'-tri-(2-hydroxy-3-methacryloyloxypropyl)-N'-mono-(2-hydroxy-3-methoxypropyl)pentaoxypropylenediamine, N,N',N'-tri-(2-hydroxy-3-methacryloyloxypropyl)-N'-mono-(2-hydroxy-3-methoxypropyl)hexaoxypropylenediamine, N,N',N'-tri-(2-hydroxy-3-methacryloyloxypropyl)-N'-mono-(2-hydroxy-3-methoxypropyl)heptaoxypropylenediamine, N,N',N'-tri-(2-hydroxy-3-methacryloyloxypropyl)-N'-mono-(2-hydroxy-3-methoxypropyl)octaoxypropylenediamine, N,N',N'-tri-(2-hydroxy-3-methacryloyloxypropyl)-N'-mono-(2-hydroxy-3-methoxypropyl)nonaoxypropylenediamine, N,N',N'-tri-(2-hydroxy-3-methacryloyloxypropyl)-N'-mono-(2-hydroxy-3-methoxypropyl)decaoxypropylenediamine, N,N'-di-(2-hydroxy-3-methacryloyloxypropyl)-N,N'-di-(2-hydroxy-3-methoxypropyl)dioxypropylenediamine, N,N'-di-(2-hydroxy-3-methacryloyloxypropyl)-N,N'-di-(2-hydroxy-3-methoxypropyl)trioxypropylenediamine, N,N'-di-(2-hydroxy-3-methacryloyloxypropyl)-N,N'-di-(2-hydroxy-3-methoxypropyl)tetraoxypropylenediamine, N,N'-di-(2-hydroxy-3-methacryloyloxypropyl)-N,N'-di-(2-hydroxy-3-methoxypropyl)pentaoxypropylenediamine, N,N'-di-(2-hydroxy-3-methacryloyloxypropyl)-N,N'-di-(2-hydroxy-3-methoxypropyl)hexaoxypropylenediamine, N,N,N'-tri-(2-hydroxy-3-methacryloyloxypropyl)-N'-mono-(2-hydroxy-3-butoxypropyl)dioxypropylenediamine, N,N,N'-tri-(2-hydroxy-3-methacryloyloxypropyl)-N'-mono-(2-hydroxy-3-butoxypropyl)trioxypropylenediamine, N,N,N'-tri-(2-hydroxy-3-methacryloyloxypropyl)-N'-mono-(2-hydroxy-3-butoxypropyl)tetraoxypropylenediamine, N,N,N'-tri-(2-hydroxy-3-methacryloyloxypropyl)-N'-mono-(2-hydroxy-3-butoxypropyl)pentaoxypropylenediamine, N,N,N'-tri-(2-hydroxy-3-methacryloyloxypropyl)-N'-mono-(2-hydroxy-3-butoxypropyl)hexaoxypropylenediamine, N,N,N'-tri-(2-hydroxy-3-methacryloyloxypropyl)-N'-mono-(2-hydroxy-3-butoxypropyl)heptaoxypropylenediamine, N,N,N'-tri-(2-hydroxy-3-methacryloyloxypropyl)-N'-mono-(2-hydroxy-3-butoxypropyl)octaoxypropylenediamine, N,N,N'-tri-(2-hydroxy-3-methacryloyloxypropyl)-N'-mono-(2-hydroxy-3-butoxypropyl)nonaoxypropylenediamine, N,N,N'-tri-(2-hydroxy-3-methacryloyloxypropyl)-N'-mono-(2-hydroxy-3-butoxypropyl)decaoxypropylenediamine, N,N'-di-(2-hydroxy-3-methacryloyloxypropyl)-N,N'-di-(2-hydroxy-3-butoxypropyl)dioxypropylenediamine, N,N'-di-(2-hydroxy-3-methacryloyloxypropyl)-N,N'-di-(2-hydroxy-3-butoxypropyl)trioxypropylenediamine, N,N'-di-(2-hydroxy-3-methacryloyloxypropyl)-N,N'-di-(2-hydroxy-3-butoxypropyl)tetraoxypropylenediamine, N,N'-di-(2-hydroxy-3-methacryloyloxypropyl)-N,N'-di-(2-hydroxy-3-butoxypropyl)pentaoxypropylenediamine, N,N'-di-(2-hydroxy-3-methacryloyloxypropyl)-N,N'-di-(2-hydroxy-3-butoxypropyl)hexaoxypropylenediamine, N,N,N'-tri-(2-hydroxy-3-methacryloyloxypropyl)-N'-mono-(2-hydroxy-3-2 ethylhexyloxypropyl)trioxypropylenediamine, N,N,N'-tri-(2-hydroxy-3-methacryloyloxypropyl)-N'-mono-(2-hydroxy-3-phenoxypropyl)trioxypropylenediamine, N,N,N'-tri-(2-hydroxy-3-methacryloyloxypropyl)-N'-mono-(2-hydroxy-3-trimethoxysilylpropyloxypropyl) trioxypropylenediamine, N,N'-di-(2-hydroxy-3-methacryloyloxypropyl)-N,N'-di-(2-hydroxy-3-trimethoxysilylpropyloxypropyl) trioxypropylenediamine, N,N,N'-tri-(2-hydroxy-3-methacryloyloxypropyl)-N'-mono-(2-hydroxy-3-methyldimethoxysilylpropyloxypropyl) trioxypropylenediamine, and N,N'-di-(2-hydroxy-3-methacryloyloxypropyl)-N,N'-di-( 2-hydroxy-3-methyldimethoxysilylpropyloxypropyl) trioxypropylenediamine.

An adduct obtained by an addition reaction of 1 mole of a mono or polyoxypropylenediamine, with n being 1 to 10, 1-4 moles of glycidyl methacrylate and 0-3 moles of a monoglycidyl ether compound selected from methyl glycidyl ether, ethyl glycidyl ether, n-propyl glycidyl ether, isopropyl glycidyl ether and n-butyl glycidyl ether, is preferred.

As the diamine derivative of the general formula (2), like the diamine derivative of the general formula (1), an adduct obtained by an addition reaction of a diamine compound having the general formula (5):

$$H_2N-X-NH_2 \quad (5)$$

in which X is a divalent group selected from the group consisting of

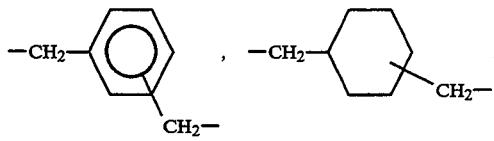

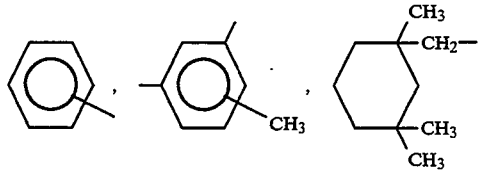

and

and m is 1 ~ 20, with glycidyl (meth)acrylate (4-1) and a monoglycidyl ether compound (4-2) not having a photopolymerizable group, is preferred. The composition thereof is not specially limited. For example, however, it is preferable that the following components be subjected to an addition reaction:

1 mole of a diamine compound (5),
1-3 moles of glycidyl (meth)acrylate (4-1), and
1-3 moles of a monoglycidyl ether compound (4-2) (e.g. methyl glycidyl ether, ethyl glycidyl ether, n-propyl glycidyl ether, isopropyl glycidyl ether, n-butyl glycidyl ether, isobutyl glycidyl ether, n-hexyl glycidyl ether, 2-ethylhexyl glycidyl ether, n-decyl glycidyl ether, allyl glycidyl ether, phenyl glycidyl ether, glycidol).

The following are mentioned as concrete examples of the diamine derivatives represented by the general formula (2), provided no limitation is made thereto:

N,N,N'-tri-(2-hydroxy-3-methacryloyloxypropyl)-N'-mono-(2-hydroxy-3-methoxypropyl)o-xylylenediamine, N,N,N'-tri-(2-hydroxy-3-methacryloyloxypropyl)-N'-mono-(2-hydroxy-3-methoxypropyl)m-xylylenedlamlne, N,N,N'-tri-(2-hydroxy-3-methacryloyloxypropyl)-N'-mono-(2-hydroxy-3-methoxypropyl)p-xylylenediamine, N,N'-di-(2-hydroxy-3-methacryloyloxypropyl)-N,N'-di-(2-hydroxy-3-methoxypropyl)m-xylylenediamine, N,N'-di-(2-hydroxy-3-methacryloyloxypropyl)-N,N'-di-(2-hydroxy-3-methoxypropyl)p-xylylenediamine, N-mono-(2-hydroxy-3-methacryloyloxypropyl)-N,N'-N'-tri-(2-hydroxy-3-methoxypropyl)m-xylylenediamine, N-mono-(2-hydroxy-3-methacryloyloxypropyl)-N,N'-N'-tri-(2-hydroxy-3-methoxypropyl)p-xylylenediamine, N-N-N'-tri-(2-hydroxy-3-acryloyloxypropyl)-N'-mono-(2-hydroxy-3-methoxypropyl)m-xylylenediamine, N-N-N'-tri-(2-hydroxy-3-acryloyloxypropyl)-N'-mono-(2-hydroxy-3-methoxypropyl)p-xylylenediamine, N-mono-(2-hydroxy-3-methacryloyloxypropyl)-N,N',N'-tri-(2-hydroxy-3-methoxypropyl)m-xylylenediamine, N-mono-(2-hydroxy-3-methacryloyloxypropyl)-N,N',N'-tri-(2-hydroxy-3-methoxypropyl)p-xylylenediamine, N,N,N'-tri-(2-hydroxy-3-methacryloyloxypropyl)-N'-mono-(2-hydroxy-3-butoxypropyl)m-xylylenediamine, N,N,N'-tri-(2-hydroxy-3-methacryloyloxypropyl)-N'-mono-(2-hydroxy-3-butoxypropyl)p-xylylenediamine, N,N'-di-(2-hydroxy-3-methacryloyloxypropyl)-N,N'-di-(2-hydroxy-3-butoxypropyl)m-xylylenediamine, N,N'-di-(2-hydroxy-3-methacryloyloxypropyl)-N,N'-di-( 2-hydroxy-3-butoxypropyl)p-xylylenediamine, N,N,N'-tri-(2-hydroxy-3-methacryloyloxypropyl)-N'-mono-(2-hydroxy-3-2 ethylhexyloxypropyl)m-xylylenediamine, N,N,N'-tri-(2-hydroxy-3-methacryloyloxypropyl)-N'-mono-(2-hydroxy-3-2 ethylhexyloxypropyl)p-xylylenediamine, N,N'-di-(2-hydroxy-3-methacryloyloxypropyl)-N,N'-di-(2-hydroxy-3-2 ethylhexyloxypropyl)m-xylylenediamine, N,N'-di-(2-hydroxy-3-methacryloyloxypropyl)-N,N'-di-(2-hydroxy-3-2 ethylhexyloxypropyl)p-xylylenediamine, N,N'-di-(2-hydroxy-3-methacryloyloxypropyl)-N,N'-di-(2-hydroxy-3-phenoxypropyl)m-xylylenediamine, and N,N'-di-(2-hydroxy-3-methacryloyloxypropyl)-N,N'-di-(2-hydroxy-3-phenoxypropyl)p-xylylenediamine.

Preferred is an adduct obtained by an addition reaction of 1 mole of m- or p-xylylenediamine, 1-3 moles of glycidyl methacrylate and 1-3 moles of a monoglycidyl ether compound selected from methyl glycidyl ether, ethyl glycidyl ether, n-propyl glycidyl ether, isopropyl glycidyl ether and n-butyl glycidyl ether.

The photosensitive layer used in the present invention may have the following composition:

|  | Part by weight |
|---|---|
| (1) Monomer of the general formula (1) | 5-70 |
| (2) Monomer of the general formula (2) | 0-70 |
| (3) At least one conventional, photopolymerizable, ethylenically unsaturated monomer or oligomer | 3-50 |
| (4) Binder polymer for retaining shape | 20-80 |
| (5) Photosensitizer | 0.2-20 |

The following composition is more preferred:

|  | Part by weight |
| --- | --- |
| (1) Monomer of the general formula (1) | 10–50 |
| (2) Monomer of the general formula (2) | 0–50 |
| (3) One or more conventional, photopolymerizable, ethylenically unsaturated monomer or oligomer | 5–20 |
| (4) Binder polymer for retaining shape | 40–70 |
| (5) Photosensitizer | 1–18 |

As typical examples of photopolymerizable, ethylenically unsaturated monomers and oligomers employable in the present invention, mention may be made of (meth) acrylic esters derived from monohydric alcohols and those from polyhydric alcohols.

The following are typical examples of ethylenically unsaturated monomers which are useful in the present invention:

(1) (Meth)acrylic esters of the following alcohols:

Methanol, ethanol, propanol, pentanol, cyclohexanol, octanol, undecanol, bornyl alcohol, ethylene glycol, polyethylene glycol, propylene glycol, polypropylene glycol, butylene glycol, nonanediol, glycerol, trimethylolmethane, pentaerythritol.

(2) Epoxy acrylates resulting from the reaction of glycidyl ether compounds and (meth)acrylic acid.

(3) Urethane acrylates such as glycerin diacrylate isophorone diisocyanate urethane prepolymer and pentaerythritol triacrylate hexamethylene diisocyanate urethane prepolymer.

As to the binder polymer used for retaining shape in the present invention, it is desirable to select one which is highly compatible with the monomers and photosensitizer used in the invention. For example, the following polymers and copolymers are emplolyable:

(1) Vinyl polymers, e.g. polyvinyl acetate, polyvinyl alcohol, polyvinyl butyral, polyvinyl methyl ether, polyvinyl chloride, and polyethylene, as well as copolymers thereof.

(2) (Meth)acrylic ester polymers, e.g. polyethyl (meth) acrylate and polybutyl (meth)acrylate, as well as copolymers thereof.

(3) Unvulcanized rubbers, e.g. natural rubber, polybutadiene, polyisobutylene, polychloroprene and polyneoprene, as well as copolymers thereof.

(2) Polyethers, e.g. polyethylene oxide and polypropylene oxide.

(5) Polyamides and copolymers of the following monomers:

Caprolactam, laurolactam, hexamethylenediamine, 4,4'-bis-aminocyclohexylmethane, 2,4,4-trimethylhexamethylen ediamine, isophoronediamine, diglycols, isophthalic acid, adipic acid, sebacic acid.

(6) Polyesters, e.g. a condensate of terephthalic acid and 1,4-butanediol.

(7) Polyurethanes, e.g. polyurethane of hexamethylene diisocyanate, toluene diisocynate or naphthalene-1,5-diisocyanate and 1,4-butanediol.

The following are typical examples of photosensitizers employable in the present invention:

(1) Benzophenone derivatives, e.g. benzophenone, Michler's ketone, 4,4'-bisdiethylaminobenzophenone, xanthone and anthrone.

(2) Benzoin derivatives, e.g. benzoin, benzoin methyl ether and benzoin ethyl ether.

(3) Quinones, e.g. p-benzoquinone, β-naphthoquinone and β-methylanthraquinone.

(4) Thioxanthones, e.g. thioxanthone, 2-chlorothioxantho ne, 2,4-diethylthioxanthone and isopropylthioxanthone.

In order to select a must suitable photosensitizer, it is desirable that the compatibility with the other components of the photosensitive layer and the spectrum of a light source used for exposure be taken into consideration.

For the purpose of improving the shelf stability of the resulting printing plate, it is also effective to incorporate a very small amount of a thermal polymerization inhibitor in the photosensitive layer. As examples of such a thermal polymerization inhibitor there are mentioned hydroquinone, hydroquinone monomethyl ether and phenothiazine.

Further, with a view to imparting a shape retaining property to the photosensitive layer, supporting the overlying silicone rubber layer horizontally with respect to the substrate surface, or improving the adhesive property of the photosensitive layer with respect to the silicone rubber layer, there may be incorporated in the photosensitive layer, for example an organosilica, a silane coupling agent or an organometllic compound.

(1) Examples of the organosilica are Oscol 1432 and Oscol 1132 (organosilica powders, manufactured by Catalysts & Chemicals Industries Co., Ltd.)

(2) Examples of the silane coupling agent are 3-aminopropyltrimethoxysilane, 3-methacryloxyproplyltrimethoxy silane, γ-glycidoxytrimethoxysilane and γ-mercaptopropyltrimethoxysilane.

(3) Examples of the organometallic compound are dibutyltin diacetate, dibutyltin dilaurate, tetrabutyl titanate and tetraisopropyl titanate.

The photosensitive layer is formed uniformly on the base substrate and its thickness is optional as long as it is in close contact with the substrate, but is preferably not larger than 300μ, more preferably not larger than 100μ. It is also useful, if necessary, to form a primer layer between the substrate and the photosensitive layer for improving the adhesion between the two or for preventing halation.

The silicone rubber layer employable in the present invention has a thickness of 0.5 to 50μ, preferably 0.5 to 10μ and also has transparency which permits the passing of ultraviolet light through the same layer. A useful silicone rubber layer is obtained by crosslinking a linear diorganopolysiloxane (preferably dimethylpolysiloxane) sparsely. A typical silicone rubber layer has the following repeating unit:

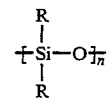

where n is an integer of 2 or more and each R is an alkyl, aryl or cyanoalkyl group having 1 to 10 carbon atoms, provided, preferably, 40% or less of the entire R is vinyl, phenyl, vinyl halide or phenyl halide, and 60% or more thereof is methyl.

In the case of the silicone rubber layer applied to the printing plate of the present invention, there is used a silicone rubber (RTV or LTV type silicone rubber) obtained by the following condensation type crosslinking. As such a silicone rubber there may be used one wherein part of R of a diorganopolysiloxane chain is substituted with H. But, usually crosslinking is performed by the condensation of end groups with each other as represented by the following formulae. As the case may be, an excess crosslinking agent is made present therein.

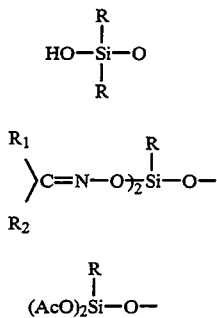

In the above formulae, R is as defined previously, $R_1$ and $R_2$ are each a monovalent lower alkyl, and Ac is acetyl. In such a condensation crosslinking type silicone rubber there is incorporated a carboxylate of a metal such as tin, zinc, lead, calcium or manganese, e.g. dibutyltin laurate, tin (II) octoate, naphthenate, or such a catalyst as chloroplantinic acid.

In the silicone rubber layer which forms the surface of the dry planographic printing master plate thus constituted, there easily arises the problem that it is difficult for a positive film to come into close contact to a satisfactory extent with the silicone rubber layer in the exposure process. To avoid this inconvenience, a thin transparent protective film may be stuck on the surface of the silicone rubber layer. The protective film is useful in the exposure process, but in the development process it is removed by peeling or dissolving, and in the printing process it is unnecessary.

A useful protective film has an ultraviolet light transmitting property and has a thickness of not larger than 100μ, preferably not larger than 10μ. Typical examples thereof are polyethylene, polypropylene, polyvinyl chloride and polyethylene terephthalate films, as well as cellophane. The surface of the protective film may have concave and convex shapes to further improve its close contact with a positive film. Instead of the protective film there may be formed a protective layer by a coating method for example.

The planographic printing master plate as a laminate according to the present invention described above is fabricated, for example, in the following manner.

First, a photosensitive layer is applied onto a base substrate and dried. Then, a silicone gum solution is applied thereto and cured throughly to form a silicone rubber layer, onto which is then stuck a protective film if necessary.

The planographic printing master plate of the present invention thus fabricated is exposed to an actinic radiation through a positive film which has been brought into close contact with the plate in vacuum. As a light source used in this exposure process there usually may be used a high-pressure mercury vapor lamp, a carbon arc lamp, a xenon lamp, or a fluorescent lamp.

After the end of exposure, the protective film is peeled off from the printing plate, then the plate is immersed in a developer, and development is performed using a pad or brush for development.

As the developer used in the present invention there usually is employed one which has been proposed as a developer for a dry planographic printing plate. Suitable examples are those comprising aliphatic hydrocarbons (e.g. hexane, heptane, "Iso Par" E,G,H (a product of Esso Chemical Co.), gasoline, kerosene, aromatic hydrocarbons (e.g. toluene, xylene) and halogenated hydrocarbons (e.g. trichlene), capable of swelling silicone rubber, and polar solvents exemplified below, as well as the following polar solvents alone or mixtures thereof:

Alcohols (e.g. methanol, ethanol, propanol, ethylene glycol, diethylene glycol, triethylene glycol, polyethylene glycol, propylene glycol, dipropylene glycol, tripropylene glycol, polypropylene glycol, 1,3-butylene glycol, 2,3-butylene glycol, hexylene glycol, 2-ethyl-1,3-hexanediol);

Ethers (e.g. ethylene glycol monoethyl ether, diethylene glycol monomethyl ether, diethylene glycol monoethyl ether, diethylene glycol monobutyl ether, diethylene glycol monohexyl ether, diethylene glycol mono-2-ethylhexyl ether, triethylene glycol monoethyl ether, tetraethylene glycol monoethyl ether, propylene glycol monomethyl ether, dipropylene glycol monoethyl ether, tripropylene glycol monomethyl ether);

Esters (e.g. ethylene glycol monomethyl ether acetate, ethylene glycol monoethyl ether acetate, diethylene glycol monomethyl ether acetate, diethylene glycol monoethyl ether acetate);

Ketones (e.g. acetone, methyl ethyl ketone, methyl isobutyl ketone, diacetone alcohol); and Carboxylic acids (e.g. 2-ethylbutyric acid, caproic acid, caprylic acid, 2-ethylhexanoic acid, captic acid, oleic acid ).

EXAMPLES

The present invention will be described below concretely by way of examples, but it is to be understood that the invention is not limited thereto.

First, an explanation will be given below about various symbols which are used in those examples. M-1: N,N,N'-tri-(2-hydroxy-3-methacryloyloxypropyl)-N'-mono-(2-hydroxy-3-butoxypropyl)trioxyethylenediamine M-2: N,N'-di-(2-hydroxy-3-methacryloyloxypropyl)-N,N'-di(2-hydroxy-3-butoxypropyl)m-xylylenediamine M-3: 1,9-nonanediol diacrylate M-4: N,N,N',N'-tetra-(2-hydroxy-3-methacryloyloxypropyl) hexaoxypropylenediamine M-5: 1,6-hexanediol diacrylate M-6: N,N,N'-tri-(2-hydroxy-3-methacryloyloxypropyl)-N,-mono-(2-hydroxy-3-methoxypropyl)trioxypropylenediamine M-7: N,N'-di-(2-hydroxy-3-methacryloyloxypropyl)-N,N'-di-(2-hydroxy-3-methoxypropyl)p-xylylenediamine M-8: Tripropylene glycol diacrylate M-9: N,N,N',N'-tetra-(2-hydroxy-3-methacryloyloxypropyl)m-xylylenediamine M-10: Epoxy acrylate FROM tripropylene glycol Example 1

A primer solution of the following composition was applied onto a degreased aluminum plate 3 mm thick and then dried at 230° C. for 1 minute to form a primer layer having a thickness of 3 g/m²:

(1) Kancoat 90T-25-3094 (epoxy-phenol 15 parts by weight resin, a product of Kansai Paint Co., Ltd.)

(2) Dimethylformamide 85 parts by weight

Then, a photosensitive solution of the following composition was applied onto the primer layer and dried at 100° C. for 1 minute to form a photosensitive layer having a thickness of 4 g/m²:

(1) Polyurethane of polyester polyol and isophorone diisocyanate, the polyester polyol comprising adipic acid and polyethylene glycol 56 parts by weight

| | |
|---|---|
| polyethylene glycol | 56 parts by weight |
| (2) M-1 | 14 parts by weight |
| (3) M-2 | 14 parts by weight |
| (4) M-3 | 8 parts by weight |
| (5) 4,4'-Bis(diethylamine)benzophenone | 5 parts by weight |
| (6) N-Methylacridone | 5 parts by weight |
| (7) Crystal Violet | 0.3 parts by weight |
| (8) Ethyl cellosolve | 580 parts by weight |

Subsequently, a silicone gum solution of the following composition was applied onto the photosensitive layer and dried at 120° C. for 2 minutes to form a silicone rubber layer having a thickness of 2 g/m$^2$:

(1) Both-end silanol polydimethylsiloxane

| | |
|---|---|
| (average molecular weight: 100,000) | 100 parts by weight |
| (2) Ethyltriacetoxysilane | 12 parts by weight |
| (3) Dibutyltin diacetate | 0.1 parts by weight |
| (4) "Iso Par" E | 750 parts by weight |

To the plate thus fabricated was laminated to a 6μ thick polyethylene terephthalate film, "Lumirror" (a product of Toray Industries Inc.) as a protective film to obtain a planographic printing master plate.

Then, a gradation positive film having a pattern of 150 lines/inch and 2% to 98% dots was brought into close contact with the master plate, followed by exposure at a distance of 1 m for 90 seconds, using an ultra-high pressure mercury vapor lamp of 3 kW (a product of Orc Manufacturing Co.).

The laminated protective film was removed from the exposed plate, then a developer of diethylene glycol mono-2-ethylhexyl ether/1,3-butylene glycol=70/30 was poured into a pretreatment vessel of an automatic dry planographic developing apparatus (TWL-1160, a product of Toray Industries Inc.), while water was poured into a development vessel, and development was performed at a pretreatment temperature of 40° C. and a conveyance speed of 100 m/min to obtain a dry planographic printing plate.

The printing plate thus obtained was mounted to an offset press (Komori Sprint 4 Color) and printing was performed for coated paper using "Driocolor" cyan ink (a product of Dainippon Ink And Chemicals, Incorporated). As a result, there were obtained prints having an extremely good image, in which 2-98% dots of 150 lines/inch were reproduced.

On the other hand, a positive film having a pattern of 150 lines/inch was brought into close contact with the foregoing planographic printing master plate and exposed to light at a distance of 1 m for 90 seconds, using an ultra-high pressure mercury vapor lamp of 3 kW (a product of Orc Manufacturing Co.), followed by development in the manner described above to obtain a dry planographic printing plate. Then, the printing plate was mounted to a commercial web offset printing press (LITHOPIA, a product of Mitsubishi Heavy Industries, Ltd.) and a durability test was conducted by printing wood-free paper at a speed of 600 r.p.m. using "Driocolor" black, cyan, magenta and yellow inks (products of Dainippon Ink And Chemicals, Incorporated). Even after printing 180,000 copies, there were obtained good prints, and a check of the printing plate after the end of printing showed that the printing plate was damaged only slightly.

Examples 2–4

Printing master plates were fabricated in the same manner as in Example 1 except that a change was made only with respect to monomers used as shown in Table.

Then, a gradation positive film having 2–98% dots of 150 lines/inch was brought into close contact with each of the planographic printing master plates thus obtained and exposure was performed at a distance of 1 m for 90 seconds using an ultra-high pressure mercury vapor lamp (a product of Orc Manufacturing Co.) of 3 kW, followed by development in the same way as in Example 1 to obtain dry planographic printing plates. Thereafter, the printing plates were each mounted to an offset press (Komori Sprint 4 Color) and an image reproducibility test was conducted by printing coated paper using "Driocolor" cyan ink (a product of Dainippon Ink And Chemicals, Incorporated). On the other hand, a positive film having a pattern of 150 lines/inch was brought into close contact with each of the above planographic printing master plates and exposure was performed at a distance of 1 m for 90 seconds using an ultra-high pressure mercury vapor lamp of 3 kW (a product of Orc Manufacturing Co.), followed by development in the same manner as in Example 1 to obtain dry planographic printing plates. Then, the printing plates thus obtained were each mounted to a commercial web offset printing press (LITHOPIA, a product of Mitsubishi Heavy Industries, Ltd.) and a durability test was conducted by printing wood-free paper at a speed of 600 r.p.m. using "Driocolor" black, indigo, deep red and yellow inks (products of Dainippon Ink And Chemicals, Incorporated).

The following table shows the results of the image reproducibility test and that of the durability test.

TABLE

| Ex. No. | Monomer Kind | Part by weight | Image Reproducibility | Durability (× 10,000 copies) |
|---|---|---|---|---|
| 2 | M-4 | 26 | 2-98 | 20 |
|   | M-5 | 10 | | |
| 3 | M-6 | 14 | 2-98 | 17 |
|   | M-7 | 14 | | |
|   | M-8 | 10 | | |
| 4 | M-6 | 18 | 3-97 | 30 |
|   | M-10 | 18 | | |

In Examples 2 and 3 using novel monomers and photosensitive layers of specific compositions according to the present invention, there were obtained prints having an extremely good image in which 2–98% dots were reproduced through a positive film having a pattern of 150 lines/inch, as shown in Table. Further, in Example 4 there were obtained prints having a good image with 3–97% dots reproduced.

As a result of the durability test using the commercial web offset printing press, there were obtained durabilities exceeding the target of 100,000 copies.

Comparative Example 1

A 15μ thick photoadhesive layer having the following composition was formed on an aluminum plate which had been subjected to graining:

| | |
|---|---|
| (1) "Polylite" TDR-1131-R (unsaturated | 65 parts by weight |

| | |
|---|---|
| polyester resin, a product of Dainippon Ink And Chemicals, Incorporated) | |
| (2) M-9 | 30 parts by weight |
| (3) Benzion methyl ether | 5 parts by weight |

Onto this photoadhesive layer was then applied a solution of the following silicone gum composition in n-heptane, followed by air-drying at room temperature for 24 hours to form a 2μ thick silicone rubber layer:

| | |
|---|---|
| (1) Dimethylpolysiloxane (average molecular weight: 100,000) | 85 parts by weight |
| (2) Methyltriacetoxysilane | 8.5 parts by weight |
| (3) Dibutyltin acetate | 0.5 parts by weight |
| (4) Aerogil (silica) | 9 parts by weight |

Then, "Lumirror" (polyester film, a product of Toray Industries Inc.) was laminated as a protective film to the surface of the silicone rubber layer thus formed, affording a planographic printing master plate. A gradation positive film having 2-98% dots of 150 lines/inch was then brought into close contact with the printing master plate and exposure was performed at a distance of 1 m for 90 seconds using an ultra-high pressure mercury vapor lamp of 3 kW (a product of Orc Manufacturing Co.).

The laminated protective film was removed from the exposed plate, then the plate was immersed in n-heptane and development was conducted using a deveoping pad.

The resulting printing was mounted to an offset press (Komori Sprint 4 Color) and printing of coated paper was performed using "Driocolor" cyan ink (a product of Dainippon Ink And Chemicals, Incorporated). As a result, there were obtained prints having an extremely good image in which 2-96% dots of 150 lines/inch were reproduced.

On the other hand, a positive film having a pattern of 150 lines/inch was brought into close contact with the above planographic printing master plate and exposure was performed at a distance of 1 m for 90 seconds using an ultra-high pressure mercury vapor lamp of 3 kW (a product of Orc Manufacturing Co.) to obtain a dry planographic printing plate. Then, the printing plate was mounted to a commercial web offset printing press (LITHOPIA, a product of Mitsubishi Heavy Industries, Ltd.) and a durability test was conducted by printing wood-free paper at a speed of 600 r.p.m. using "Driocolor" black, cyan, magenta and yellow inks (products of Dainippon Ink And Chemicals, Incorporated). As a result, there were obtained good prints of 50,000 copies, but a further printing caused stain due to flaws on the plate surface.

The target of 100,000 copies to meet many orders requesting the printing of a larger number of copies in the recent commercial web offset printing presses was not attained.

Example 5 and Comparative Example 2

Using the planographic printing master plate obtained in Exmaple 4, there were performed exposure and development in the same way as in Example 1 to afford a dry planographic printing plate. Then, the printing plate was mounted to a web offset press for newspaper (a product of Hamada Kikai Co.) and a durability test was conducted by printing woody paper as newsprint at a speed of 30,000 copies/hr. As a result, there were obtained good prints of 50,000 copies.

On the other hand, using the planographic printing master plate obtained in Comparative Example 1, there were performed exposure and development in the same manner as in Comparative Example 1 to afford a dry planographic printing plate. The printing plate was then mounted to a web offset printing press for newspaper (a product of Hamada Kikai Co.) and a durability test was conducted by printing woody paper as newsprint at a speed of 30,000 copies/hr. As a result, there were obtained good prints of 10,000 copies, but a further printing caused flaws and stain on the plate surface due to paper dust generated from the newspaper.

EFFECTS OF THE INVENTION

In the dry planographic printing plate according to the present invention, since the photosensitive layer has a specific composition as described above, there can be attained excellent practical effects; for example, extremely superior durability and image reproducibility can be exhibited even when the printing plate is applied to commercial and newspaper web offset printing presses which application has been difficult in the use of conventional dry planographic printing plates.

What is claimed is:

1. A laminate comprising a base substrate, a photosensitive layer and a silicone rubber layer, said photosensitive layer and said silicone rubber layer being laminated successively onto said base substrate, and said photosensitive layer containing a diamine derivative represented by the following general formula (1):

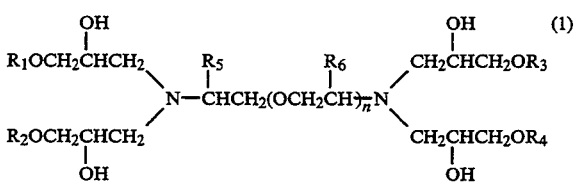

in which $R_1$, $R_2$, $R_3$ and $R_4$ are each independently a) hydrogen or b) hydrocarbon or substituted hydrocarbon group having 1 to 20 carbon atoms, $R_5$ and $R_6$ are each independently hydrogen or an alkyl group having 1 to 20 carbon atoms, and n is 1 to 50.

2. A laminate as set forth in claim 1, wherein $R_1$, $R_2$, $R_3$ and $R_4$ are each independently hydrogen, alkyl, aryl, acryloyl or methacryloyl.

3. A laminate as set forth in claim 1, wherein one to four of $R_1$, $R_2$, $R_3$ and $R_4$ in the diamine derivative of the general formula (1) is (are) acryloyl or methacryloyl group(s).

4. A laminate as set forth in claim 3, wherein the rest, if any, of $R_1$, $R_2$, $R_3$ and $R_4$ in the diamine derivtive of the general formula (1) is (are) a hydrogen atom(s) or a hydrocarbon or substituted hydrocarbon group(s).

5. A laminate as set forth in claim 1, wherein n in the diamine derivative of the general formula (1) is 1 to 10.

6. A laminate as set forth in claim 1, wherein $R_5$ and $R_6$ in the general formula (1) are each independently hydrogen or methyl.

7. A laminate comprising a base substrate, a photosensitive layer and a silicone rubber layer, said photosensitive layer and said silicone robber layer being laminated successively onto said base substrate, and said photosensitive layer containing a diamine derivative represented by the following general formula (1):

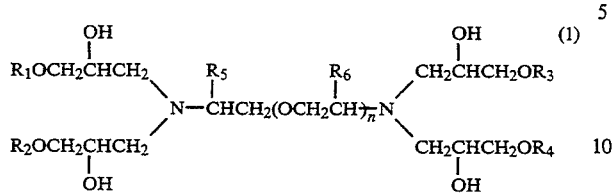

in which $R_1$, $R_2$, $R_3$, and $R_4$ are each independently a) hydrogen or b) a hydrocarbon or substituted hydrocarbon group having 1 to 20 carbon atoms, $R_5$ and $R_6$ are each independently hydrogen or an alkyl group having 1 to 20 carbon atoms, and n is 1 to 50, and a diamine derivative represented by the following general formula (2):

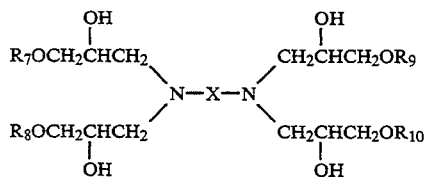

in which $R_7$, $R_8$, $R_9$ and $R_{10}$ are each independently a) hydrogen or b) a hydrocarbon or substituted hydrocarbon group having 1 to 20 carbon atoms, X is a divalent group selected from the group consisting of

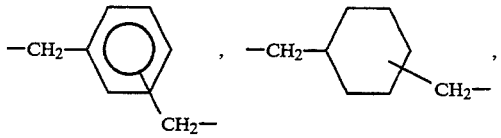

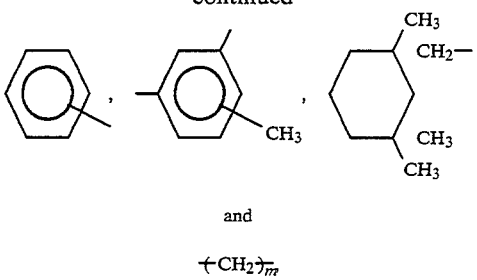

and $+CH_2\!\!+_{\!\!\overline{m}}$ and m is 1 ~ 20.

8. A laminate as set forth in claim 7, wherein $R_1$, $R_2$, $R_3$, $R_4$, $R_7$, $R_8$, $R_9$ and $R_{10}$ in said general formulae are each independently hydrogen, alkyl, aryl, acryloyl or methacryloyl.

9. A laminate as set forth in claim 7, wherein one to three of $R_7$, $R_8$, $R_9$, and $R_{10}$ in the diamine derivative of the general formula (2) is (are) acryloyl or methacryloyl group(s).

10. A laminate as set forth in claim 9, wherein the rest, if any, of $R_7$, $R_8$, $R_9$ and $R_{10}$ in the diamine derivative of the general formula (2) is (are) a hydrogen atom(s) or a hydrocarbon or substituted hydrocarbon group(s).

11. A laminate as set forth in claim 7, wherein said photosensitive layer consists essentially of 5–70 parts by weight of a diamine derivative represented by the general formula (1), 0–70 parts by weight of a diamine derivative represented by the general formula (2), 3–50 parts by weight of at least one photopolymerizable, ethylenically unsaturated monomer or oligomer, 20–80 parts by weight of a binder polymer for retaining shape, 0.2–20 parts by weight of a photosensitizer.

12. A laminate as set forth in claim 11, wherein said photosensitive layer consists essentially of 10–50 parts by weight of a diamine derivative represented by the general formula (1), 0–50 parts by weight of a diamine derivative represented by the general formula (2), 5–20 parts by weight of at least one photopolymerizable, ethylenically unsaturated monomer or oligomer, 40–70 parts by weight of a binder polymer for retaining shape, and 1–18 parts by weight of a photosensitizer.

* * * * *

UNITED STATES PATENT AND TRADEMARK OFFICE
CERTIFICATE OF CORRECTION

PATENT NO. : 5,397,681          Page 1 of 2

DATED : March 14, 1995

INVENTOR(S) : Mikio Tsuda et al

It is certified that error appears in the above-indentified patent and that said Letters Patent is hereby corrected as shown below:

In Column 1, line 41, delete "54-6923B" and substitute --54-26923B--.

In Column 6, line 3, delete "-B-" and substitute -- -3- --.

In Column 12, line 31, delete "captic" and substitute --capric--.

In Column 13, line 5 and about line 12, delete the horizontal lines and enlarge the size of the type of the text currently between those lines to conform to the size of the type of the text in lines 1-3;
    line 20 and about line 23, delete the horizontal lines and enlarge the size of the type of the text currently between those lines to conform to the size of the type of the text in lines 14-18.

UNITED STATES PATENT AND TRADEMARK OFFICE
CERTIFICATE OF CORRECTION

PATENT NO. : 5,397,681
DATED : March 14, 1995
INVENTOR(S) : Mikio Tsuda et al

It is certified that error appears in the above-indentified patent and that said Letters Patent is hereby corrected as shown below:

In Column 18, between line 2 and about line 9, delete
"
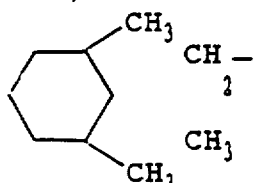
"
and substitute
--
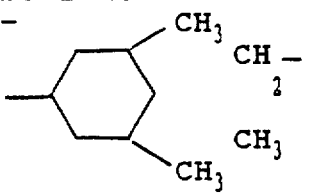
--

Signed and Sealed this

Sixth Day of June, 1995

Attest:

BRUCE LEHMAN

Attesting Officer      Commissioner of Patents and Trademarks